(12) United States Patent
Umehara et al.

(10) Patent No.: US 11,066,548 B2
(45) Date of Patent: Jul. 20, 2021

(54) POLYPHENYLENE ETHER RESIN COMPOSITION, PREPREG, METAL-CLAD LAMINATE, AND PRINTED WIRING BOARD

(71) Applicant: PANASONIC INTELLECTUAL PROPERTY MANAGEMENT CO., LTD., Osaka (JP)

(72) Inventors: Hiroaki Umehara, Fukushima (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/880,593

(22) Filed: May 21, 2020

(65) Prior Publication Data
US 2020/0283615 A1 Sep. 10, 2020

Related U.S. Application Data

(60) Division of application No. 16/029,064, filed on Jul. 6, 2018, now abandoned, which is a continuation of application No. PCT/JP2017/000933, filed on Jan. 13, 2017.

(30) Foreign Application Priority Data

Jan. 19, 2016 (JP) .............................. JP2016-008004

(51) Int. Cl.
| | |
|---|---|
| *C08L 51/08* | (2006.01) |
| *C08J 5/24* | (2006.01) |
| *B32B 15/08* | (2006.01) |
| *C08L 71/12* | (2006.01) |
| *C08L 101/12* | (2006.01) |
| *C08F 222/10* | (2006.01) |
| *C08L 33/04* | (2006.01) |
| *H05K 1/03* | (2006.01) |
| *C08L 71/00* | (2006.01) |
| *C08F 2/44* | (2006.01) |
| *C08G 65/48* | (2006.01) |
| *C08F 290/06* | (2006.01) |
| *H05K 1/02* | (2006.01) |

(52) U.S. Cl.
CPC .............. *C08L 51/08* (2013.01); *B32B 15/08* (2013.01); *C08F 2/44* (2013.01); *C08F 222/10* (2013.01); *C08F 290/062* (2013.01); *C08G 65/485* (2013.01); *C08J 5/24* (2013.01); *C08L 33/04* (2013.01); *C08L 71/00* (2013.01); *C08L 71/12* (2013.01); *C08L 101/12* (2013.01); *H05K 1/024* (2013.01); *H05K 1/0271* (2013.01); *H05K 1/032* (2013.01); *H05K 1/0373* (2013.01); *C08F 222/102* (2020.02); *C08J 2351/08* (2013.01); *C08J 2409/00* (2013.01); *C08J 2409/06* (2013.01); *C08J 2433/10* (2013.01); *C08L 2201/02* (2013.01); *C08L 2201/08* (2013.01); *C08L 2203/20* (2013.01); *H05K 1/0366* (2013.01); *H05K 2201/012* (2013.01); *H05K 2201/0158* (2013.01); *H05K 2201/0284* (2013.01); *H05K 2201/0293* (2013.01); *H05K 2201/09136* (2013.01)

(58) Field of Classification Search
CPC .......................... C08L 71/126; C08L 2312/02
See application file for complete search history.

(56) References Cited

U.S. PATENT DOCUMENTS

| | | |
|---|---|---|
| 2003/0096123 A1 | 5/2003 | Yeager |
| 2003/0215588 A1 | 11/2003 | Yeager et al. |
| 2004/0146692 A1 | 7/2004 | Inoue et al. |
| 2014/0275377 A1 | 9/2014 | Yin |
| 2015/0218326 A1 | 8/2015 | Kitai |
| 2016/0060429 A1 | 3/2016 | Kitai et al. |
| 2016/0145370 A1 | 5/2016 | Kitai et al. |

(Continued)

FOREIGN PATENT DOCUMENTS

| | | |
|---|---|---|
| CN | 1468904 A | 1/2004 |
| CN | 103965606 A | 8/2014 |

(Continued)

OTHER PUBLICATIONS

Chinese Search Report dated Feb. 3, 2020 for CN Patent Application No. 201780007077.3, English translation.

(Continued)

*Primary Examiner* — Ana L. Woodward
(74) *Attorney, Agent, or Firm* — Greenblum & Bernstein, P.L.C.

(57) ABSTRACT

A polyphenylene ether resin composition includes a modified polyphenylene ether copolymer, a high-molecular-weight compound, and a crosslinking agent for the modified polyphenylene ether copolymer. The modified polyphenylene ether copolymer includes a substituent having a carbon-carbon unsaturated double bond at a molecular chain end of the modified polyphenylene ether copolymer. The high-molecular-weight compound has a glass transition temperature (Tg) measured by differential scanning calorimetry of 20° C. or lower and has a number-average molecular weight Mn ranging from 1000 to 10000, inclusive. The crosslinking agent includes at least two carbon-carbon unsaturated double bonds per molecule, and includes at least one of dicyclopentadiene acrylate and dicyclopentadiene methacrylate. In a cured state of the polyphenylene ether resin composition, the modified polyphenylene ether copolymer is phase separated from the high-molecular-weight compound.

10 Claims, 2 Drawing Sheets

(56) References Cited

U.S. PATENT DOCUMENTS

2016/0168378 A1    6/2016   Umehara et al.
2017/0029619 A1    2/2017   Lin et al.

FOREIGN PATENT DOCUMENTS

| | | |
|---|---|---|
| CN | 105694425 A | 6/2016 |
| CN | 106398173 A | 2/2017 |
| JP | 2005-522553 | 7/2005 |
| JP | 2006-516297 | 6/2006 |
| JP | 2014-185343 A | 10/2014 |
| JP | 2015-086330 | 5/2015 |
| JP | 2019-051679 A | 4/2019 |
| WO | 2014/203511 A1 | 12/2014 |

OTHER PUBLICATIONS

Saudi Basic Industries Corporation, Purity + Performance, 20 pages, Dec. 31, 2014.
ISR issued in PCT/JP2017/000933, dated Apr. 18, 2007, English translation.
English Translation of Chinese Search Report dated Jul. 27, 2020 for Chinese Patent Application No. 201780007077.3.

POLYPHENYLENE ETHER RESIN COMPOSITION, PREPREG, METAL-CLAD LAMINATE, AND PRINTED WIRING BOARD

This application is a divisional of U.S. application Ser. No. 16/029,064, filed Jul. 6, 2018, which is a continuation of International Patent Application No. PCT/JP2017/000933, filed Jan. 13, 2017, which claims the benefit of Japanese Patent Application No. 2016-008004, filed Jan. 19, 2016. The disclosure of each of the above-mentioned documents is entirely incorporated herein by reference.

BACKGROUND

1. Technical Field

The present disclosure relates to a polyphenylene ether resin composition, a prepreg, a metal-clad laminate, and a printed wiring board.

2. Description of the Related Art

In recent years, because of development of electric devices for high-volume signals, a semiconductor substrate and the like is required to have dielectric characteristics such as a low dielectric constant and a low dielectric dissipation factor, which are necessary for high speed communication.

A polyphenylene ether (PPE) is known to be excellent in dielectric characteristics such as a dielectric constant and a dielectric dissipation factor and to be excellent in dielectric characteristics even in a high-frequency band (high-frequency region) from a MHz band to a GHz band. Therefore, it has been considering that the polyphenylene ether is used as, for example, a molding material for high-frequency application. More specifically, it has been considering that the polyphenylene ether is used as, for example, a substrate material constituting a base of a printed wiring board provided in electronic devices compatible with high-frequency bands.

Until now, a resin composition containing a modified polyphenylene ether compound disclosed in Japanese Translation of PCT International Application Publication No. JP-T-2006-516297 has been proposed as a resin composition containing a compound obtained by modifying the polyphenylene ether.

Japanese Translation of PCT International Application Publication No. JP-T-2006-516297 discloses a polyphenylene ether resin composition containing a crosslinking curing agent; and a polyphenylene ether that has a polyphenylene ether moiety in a molecular structure, has, for example, a p-ethenylbenzyl group or an m-ethenylbenzyl group at a molecular chain end, and has a number-average molecular weight ranging from 1000 to 7000, inclusive.

SUMMARY

A polyphenylene ether resin composition according to one aspect of the present disclosure includes a modified polyphenylene ether copolymer including a substituent having a carbon-carbon unsaturated double bond at a molecular chain end of the modified polyphenylene ether copolymer. The polyphenylene ether resin composition further includes a high-molecular-weight compound having a number-average molecular weight Mn ranging from 1000 to 10000, inclusive and having a glass transition temperature (Tg) of 20° C. or lower. The glass transition temperature is measured by differential scanning calorimetry. The modified polyphenylene ether copolymer is phase separated from the high-molecular-weight compound in a cured state of the polyphenylene ether resin composition.

Further, the polyphenylene ether resin composition preferably contains a crosslinking agent for the modified polyphenylene ether copolymer. The crosslinking agent has at least two carbon-carbon unsaturated double bonds per molecule.

The high-molecular-weight compound preferably has a structure of at least one selected from a polybutadiene skeleton and a (meth)acrylate skeleton.

Further, in the polyphenylene ether resin composition, the modified polyphenylene ether copolymer preferably has a weight-average molecular weight ranging from 500 to 5000, inclusive. And an average number of the substituent at a molecule chain end in the modified polyphenylene ether copolymer ranges from 1 to 3, inclusive.

The substituent at the molecular chain end of the modified polyphenylene ether copolymer is preferably a substituent represented by following formula (1).

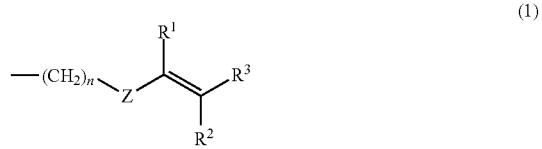

(1)

(In the formula, n represents an integer of 0 to 10, and Z represents an arylene group. When n equals 0, Z represents either the arylene group or a carbonyl group. $R^1$ to $R^3$ independently represent a hydrogen atom or an alkyl group.)

Further, in the polyphenylene ether resin composition, the crosslinking agent is preferably a compound represented by a following formula.

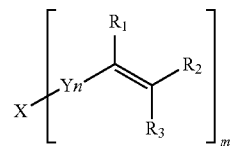

(In the formula, m represents an integer of 1 to 3, n represents 0 or 1, and $R^1$ to $R^3$ independently represent a hydrogen atom or an alkyl group. X represents any one of an arylene group, a dicyclopentadienyl group, a group having a tricyclodecane skeleton, and an isocyanurate group. Y represents

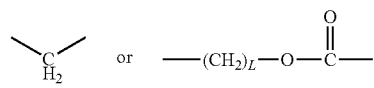

[in the formula, L represents an integer of 1 or more].)

The polyphenylene ether resin composition preferably further contains an inorganic filler.

A content ratio of the inorganic filler ranges from 40 parts by mass to 200 parts by mass, inclusive, relative to 100 parts by mass of a total of the modified polyphenylene ether copolymer, the high-molecular-weight compound, and the crosslinking agent.

The polyphenylene ether resin composition preferably further contains a reaction initiator.

The polyphenylene ether resin composition preferably further contains a flame retardant.

A prepreg according to another aspect of the present disclosure includes a resin layer having a half-cured product of the polyphenylene ether resin composition described above, and a fibrous substrate provided in the resin layer.

A metal-clad laminate according to another aspect of the present disclosure includes a cured product of the prepreg described above, and a metal foil provided on at least one surface of the cured product.

A printed wiring board according to another aspect of the present disclosure includes a cured product of the prepreg described above, and a conductor pattern provided as a circuit on a surface of the cured product.

According to the present disclosure, there can be provided a polyphenylene ether resin composition that gives a cured product having excellent dielectric characteristics, the cured product giving, for example, a laminate that generates less warpage; a prepreg formed of the polyphenylene ether resin composition; a metal-clad laminate including the prepreg; and a printed wiring board produced using the prepreg.

DETAILED DESCRIPTION OF EMBODIMENT

Figure 1:
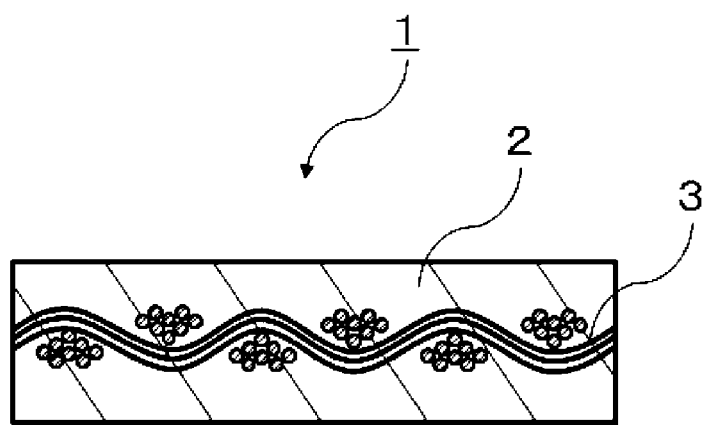
FIG. 1 is a schematic sectional view illustrating a prepreg according to an exemplary embodiment.

Japanese Translation of PCT International Application Publication No. JP-T-2006-516297 describes that it is possible for the polyphenylene ether resin composition described in the application to provide a laminate having excellent dielectric characteristics and heat resistance.

On the other hand, accompanying reduction in size and thickness of electronic devices, a surface mount package is recently increasingly used as an electronic component provided in electronic devices. In these semiconductor packages, suppression of warpage is becoming an important problem in terms of connection reliability and mounting reliability. A PPE resin, however, generally tends to have a large coefficient of thermal expansion (CTE) while having excellent dielectric characteristics. That is, a laminate formed of the polyphenylene ether resin composition described above is capable of accelerating transmission speed of electric signals but has a problem of being unable to suppress warpage of a package substrate.

The present disclosure has been made in view of such circumstances and provides a polyphenylene ether resin composition capable of suppressing warpage of a substrate material while allowing a cured product of the resin composition to maintain excellent dielectric characteristics, which has been provided by a cured product of a conventional resin composition. In addition, there are also provided a prepreg formed of the polyphenylene ether resin composition, a metal-clad laminate including the prepreg, and a printed wiring board including the prepreg.

The polyphenylene ether resin composition according to an exemplary embodiment of the present disclosure contains a modified polyphenylene ether copolymer and a high-molecular-weight compound. The modified polyphenylene ether copolymer is obtained by modifying a polyphenylene ether copolymer such that a phenolic hydroxy group at a molecular chain end of the polyphenylene ether copolymer is substituted with a substituent having a carbon-carbon unsaturated double bond. The high-molecular-weight compound has a number-average molecular weight Mn ranging from 1000 to 10000, inclusive has a glass transition temperature (Tg) of 20° C. or lower. The glass transition temperature is measured by differential scanning calorimetry. In a cured state of the polyphenylene ether resin composition, the modified polyphenylene ether copolymer is phase separated from the high-molecular-weight compound.

Such a polyphenylene ether resin composition is capable of giving a cured product having excellent dielectric characteristics, the cured product giving, for example, a laminate that generates less warpage.

Hereinafter, components of the polyphenylene ether resin composition according to the present exemplary embodiment are specifically described.

The modified polyphenylene ether copolymer used in the present exemplary embodiment is not particularly limited as long as the modified polyphenylene ether copolymer is a modified polyphenylene ether copolymer that has been terminally modified with a substituent having a carbon-carbon unsaturated double bond.

The substituent having a carbon-carbon unsaturated double bond is not particularly limited and examples include a substituent represented by following formula (1).

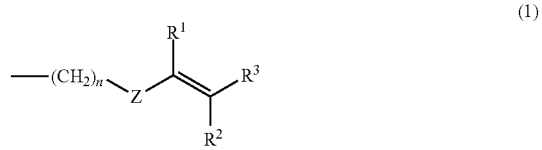

(In the formula, n represents an integer of 0 to 10, and Z represents an arylene group. When n equals 0, Z represents either the arylene group or a carbonyl group. $R^1$ to $R^3$ independently represent a hydrogen atom or an alkyl group.)

Here, in formula (1), when n equals 0, Z directly bonds to a molecular chain end of a polyphenylene ether.

Examples of the arylene group and the carbonyl group represented by Z in formula (1) include monocyclic aromatic groups such as a phenylene group and polycyclic aromatic groups such as a naphthalene ring. Examples also include derivatives that have been substituted at a hydrogen atom bonded to an aromatic ring, with a functional group such as an alkenyl group, an alkynyl group, a formyl group, an alkylcarbonyl group, an alkenylcarbonyl group, or an alkynylcarbonyl group.

Preferable specific examples of the substituent represented by formula (1) include a substituent having a vinylbenzyl group. Specific examples include at least one substituent selected from following formulae (2) and (3).

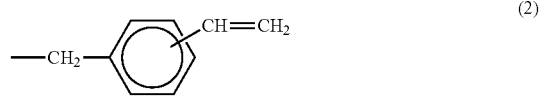

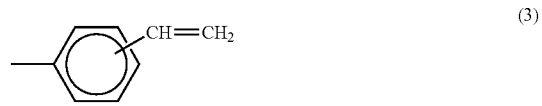

A (meth)acrylate group is an example of another substituent that is used for terminal modification in the modified polyphenylene ether copolymer of the present exemplary embodiment, has a carbon-carbon unsaturated double bond, and is represented by, for example, following formula (4).

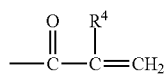

(4)

(In the formula, $R^4$ represents a hydrogen atom or an alkyl group.)

The modified polyphenylene ether copolymer used in the present exemplary embodiment is not particularly limited in terms of weight-average molecular weight but has a weight-average molecular weight ranging preferably from 500 to 5000, inclusive, more preferably from 800 to 4000, inclusive, further preferably from 1000 to 3000, inclusive. Here, the weight-average molecular weight may be measured by any general molecular weight measuring method and is specifically, for example, a value measured using gel permeation chromatography (GPC).

The modified polyphenylene ether copolymer having a weight-average molecular weight of 500 or more is considered to more certainly give a resin composition that give a cured product having excellent dielectric characteristics of the polyphenylene ether and further having significantly excellent adhesiveness and heat resistance. This is considered to be brought about for following reasons. A typical polyphenylene ether having a weight-average molecular weight within such a range, which is relatively low molecular weight, tends to decrease heat resistance of a cured product. As regards this point, the modified polyphenylene ether copolymer of the present exemplary embodiment has at least one unsaturated double bond at a molecular chain end, so that a cured product having sufficiently high Tg, heat resistance, and adhesiveness is considered to be obtained. The modified polyphenylene ether copolymer having a weight-average molecular weight of 5000 or less improves moldability, solvent solubility, and preservation stability and is thus preferable.

The modified polyphenylene ether copolymer used in the present exemplary embodiment has an average number of substituents at a molecule chain end (number of terminal substituents) per molecule of preferably 1.5 to 3, inclusive, more preferably 1.7 to 2.7, inclusive, further preferably 1.8 to 2.5, inclusive, the substituents having a carbon-carbon unsaturated double bond. The modified polyphenylene ether copolymer having excessively less substituents is considered to make, for example, a crosslinking point less likely to be formed, giving a tendency of a cured product not to have sufficient heat resistance. On the other hand, the modified polyphenylene ether copolymer having excessively many terminal substituents excessively increase reactivity. This may cause troubles such as a decrease in preservability of the polyphenylene ether resin composition and a decrease in fluidity of the polyphenylene ether resin composition.

The number of terminal substituents of the modified polyphenylene ether copolymer is, for example, a numerical value representing an average value of the number of substituents per molecule of all molecules of the modified polyphenylene ether copolymer that are present in 1 mol of the modified polyphenylene ether copolymer. The number of terminal substituents can be measured by, for example, measuring a number of hydroxy groups remaining in an obtained modified polyphenylene ether copolymer and calculating a decrement of the number of hydroxy groups from the number of hydroxy groups of an unmodified polyphenylene ether. The decrement of the number of hydroxy groups from the number of hydroxy groups of the unmodified polyphenylene ether is a number of terminal substituents. The number of hydroxy groups remaining in the modified polyphenylene ether copolymer can be acquired by adding a quaternary ammonium salt (tetraethylammonium hydroxide) that associates with a hydroxy group to a solution of the modified polyphenylene ether copolymer and measuring UV absorption of a resultant mixed solution.

The modified polyphenylene ether copolymer used in the present exemplary embodiment has an intrinsic viscosity ranging preferably from 0.03 dl/g to 0.12 dl/g, inclusive, more preferably from 0.04 dl/g to 0.11 dl/g, inclusive, further preferably from 0.06 dl/g to 0.095 dl/g, inclusive. The modified polyphenylene ether copolymer having excessively low intrinsic viscosity tends to have low molecular weight, making it difficult to give low dielectric characteristics such as a low dielectric constant and a low dielectric dissipation factor. On the other hand, the modified polyphenylene ether copolymer having excessively high intrinsic viscosity is high in viscosity, not giving sufficing fluidity to deteriorate the moldability for a cured product. Accordingly, the modified polyphenylene ether copolymer having an intrinsic viscosity within the above range is capable of realizing a cured product having excellent heat resistance and adhesiveness.

The intrinsic viscosity referred to herein is intrinsic viscosity measured in methylene chloride at 25° C., more specifically, for example, a value or the like obtained by measuring a methylene chloride solution with a concentration of 0.18 g/45 ml (liquid temperature 25° C.) by a viscometer. Examples of the viscometer include ViscoSystem AVS 500 manufactured by SCHOTT Instruments GmbH.

Further, a content proportion of a high-molecular-weight component in the modified polyphenylene ether copolymer used in the present exemplary embodiment preferably is 5% by mass or less, the high-molecular-weight component having a molecular weight of 13000 or more. That is, the modified polyphenylene ether copolymer of the present exemplary embodiment preferably has a relatively narrow molecular weight distribution. Particularly, the modified polyphenylene ether copolymer of the present exemplary embodiment preferably has a small content proportion of the high-molecular-weight component having a molecular weight of 13000 or more and may contain no such a high-molecular-weight component. That is, a lower limit value of a range for the content proportion of the high-molecular-weight component having a molecular weight of 13000 or more may be 0% by mass. The content proportion of the high-molecular-weight component having a molecular weight of 13000 or more in the modified polyphenylene ether copolymer may range from 0% by mass to 5% by mass, inclusive, and more preferably from 0% by mass to 3% by mass, inclusive. As described above, the modified polyphenylene ether copolymer having a small content proportion of the high-molecular-weight component and thus having a narrow molecular weight distribution has higher reactivity for contributing to a curing reaction, and gives a polyphenylene ether resin composition having more excellent fluidity.

The content proportion of the high-molecular-weight component can be calculated, for example, based on a molecular weight distribution obtained through measurement with use of gel permeation chromatography (GPC). Specifically, the content proportion of the high-molecular-weight component can be calculated from a proportion of a peak area based on a curve representing the molecular weight distribution obtained by GPC, the peak area corresponding to the high-molecular-weight component.

The modified polyphenylene ether copolymer of the present exemplary embodiment has a polyphenylene ether chain in a molecule, and preferably has, for example, a repeating unit represented by following formula (5) in a molecule.

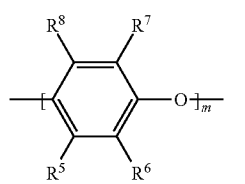

(5)

In formula (5), m represents 1 to 50. $R^5$, $R^6$, $R^7$, and $R^8$ are independent from one another. That is, $R^5$, $R^6$, $R^7$, and $R^8$ may be the same group or different groups. $R^5$, $R^6$, $R^7$, and $R^8$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferred.

The functional groups represented by $R^5$, $R^6$, $R^7$, and $R^8$ are specifically as follows, for example.

The alkyl group is not particularly limited, but is preferably an alkyl group having 1 to 18 carbon atoms, more preferably an alkyl group having 1 to 10 carbon atoms, for example. Specific examples include a methyl group, an ethyl group, a propyl group, a hexyl group, and a decyl group.

The alkenyl group is not particularly limited, but is preferably an alkenyl group having 2 to 18 carbon atoms, more preferably an alkenyl group having 2 to 10 carbon atoms, for example. Specific examples include a vinyl group, an allyl group, and a 3-butenyl group.

The alkynyl group is not particularly limited, but is preferably an alkynyl group having 2 to 18 carbon atoms, more preferably an alkynyl group having 2 to 10 carbon atoms, for example. Specific examples include an ethynyl group and a prop-2-yn-1-yl group (propargyl group).

The alkylcarbonyl group is not particularly limited as long as the alkylcarbonyl group is a carbonyl group that has been substituted with an alkyl group. The alkylcarbonyl group, however, is preferably an alkylcarbonyl group having 2 to 18 carbon atoms, more preferably an alkylcarbonyl group having 2 to 10 carbon atoms, for example. Specific examples include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as the alkenylcarbonyl group is a carbonyl group that has been substituted with an alkenyl group. The alkenylcarbonyl group, however, is preferably an alkenylcarbonyl group having 3 to 18 carbon atoms, more preferably an alkenylcarbonyl group having 3 to 10 carbon atoms, for example. Specific examples include an acryloyl group, a methacryloyl group, and a crotonoyl group.

The alkynylcarbonyl group is not particularly limited as long as the alkynylcarbonyl group is a carbonyl group that has been substituted with an alkynyl group. The alkynylcarbonyl group, however, is preferably an alkynylcarbonyl group having 3 to 18 carbon atoms, more preferably an alkynylcarbonyl group having 3 to 10 carbon atoms, for example. Specific examples include a propioloyl group.

When the modified polyphenylene ether copolymer has the repeating unit represented by formula (5) in a molecule, m is preferably such a numerical value that the modified polyphenylene ether copolymer has a weight-average molecular weight within the above range. Specifically, m is preferably 1 to 50.

A method for synthesizing the modified polyphenylene ether copolymer used in the present exemplary embodiment is not particularly limited as long as the method is capable of synthesizing the modified polyphenylene ether copolymer that has been terminally modified with a substituent having a carbon-carbon unsaturated double bond. Specific examples include a method for reacting, with a compound represented by following formula (6), a polyphenylene ether having a hydrogen atom of a terminal phenolic hydroxy group substituted by an alkali metal (e.g., sodium and potassium) atom.

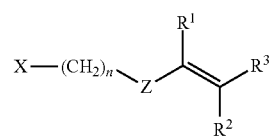

(6)

In formula (6), n represents an integer of 0 to 10, Z represents an arylene group, and $R^1$ to $R^3$ independently represent a hydrogen atom or an alkyl group, as in formula (1). X represents a halogen atom, and specific examples include a chlorine atom, a bromine atom, an iodine atom, and a fluorine atom. Among these, a chlorine atom is preferred.

The compound represented by formula (6) is not particularly limited, but is preferably p-chloromethylstyrene or m-chloromethylstyrene, for example.

As the compound represented by formula (6), the compounds exemplified above may be used alone or in combination of two or more.

The polyphenylene ether as a raw material is not particularly limited as long as the polyphenylene ether is capable of finally synthesizing a predetermined modified polyphenylene ether copolymer. Specific examples include those containing as a main component the polyphenylene ether, such as a polyarylene ether copolymer composed of 2,6-dimethylphenol and at least one of a bifunctional phenol or a trifunctional phenol, and poly(2,6-dimethyl-1,4-phenylene oxide). Specific examples of such a polyphenylene ether include a polyphenylene ether having a structure represented by following formula (7).

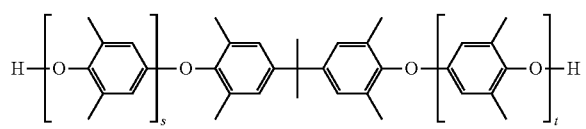

(7)

In formula (7), as regards s and t, a total value of s and t preferably ranges from 1 to 30, for example. Further, s preferably ranges from 0 to 20, and t preferably ranges from 0 to 20. That is, it is preferred that s represents 0 to 20, t represents 0 to 20, and a total of s and t represents 1 to 30.

The method for synthesizing the modified polyphenylene ether copolymer is as exemplified above. Specifically, the polyphenylene ether described above and the compound represented by formula (6) are dissolved in a solvent and stirred. In this manner, the polyphenylene ether reacts with the compound represented by formula (6) to give the modified polyphenylene ether copolymer used in the present exemplary embodiment.

This reaction is preferably carried out in presence of an alkali metal hydroxide. This manner is considered to suitably progress the reaction.

The alkali metal hydroxide is not particularly limited as long as the alkali metal hydroxide is capable of functioning as a dehalogenation agent, and examples include sodium hydroxide. The alkali metal hydroxide is typically used in a state of an aqueous solution and used specifically as a sodium hydroxide aqueous solution.

Reaction conditions such as reaction time and reaction temperature vary depending on, for example, the compound represented by formula (6) and are not particularly limited as long as the conditions allow the reaction described above to suitably proceed. Specifically, the reaction temperature ranges preferably from room temperature to 100° C., more preferably from 30° C. to 100° C. The reaction time ranges preferably from 0.5 hours to 20 hours, more preferably from 0.5 hours to 10 hours.

The solvent used in the reaction is not particularly limited as long as the solvent is capable of dissolving the polyphenylene ether and the compound represented by formula (6) and does not inhibit the reaction between the polyphenylene ether and the compound represented by formula (6). Specific examples include toluene.

The reaction is preferably carried out while not only the alkali metal hydroxide but also a phase transfer catalyst is present. That is, the reaction is preferably carried out in presence of the alkali metal hydroxide and a phase transfer catalyst. This manner is considered to more suitably progress the reaction.

The phase transfer catalyst is not particularly limited, and examples include quaternary ammonium salts such as tetra-n-butyl ammonium bromide.

The polyphenylene ether resin composition according to the present exemplary embodiment contains, as the modified polyphenylene ether copolymer, the modified polyphenylene ether copolymer obtained as described above to give a cured product having low dielectric characteristics and high heat resistance.

Next described is the high-molecular-weight compound used in the present exemplary embodiment, i.e., the high-molecular-weight compound having a number-average molecular weight Mn ranging from 1000 to 10000, inclusive and having a glass transition temperature (Tg) of 20° C. or lower. The glass transition temperature is measured by DSC (differential scanning calorimetry).

The high-molecular-weight compound of the present exemplary embodiment is characterized by being a low elastic component, having a Tg of as low as 20° C. or lower, having a number-average molecular weight Mn ranging from 1000 to 10000, inclusive. And the high-molecular-weight compound causes phase separation from the modified polyphenylene ether copolymer when the resin composition is made into a cured state.

By using the high-molecular-weight compound, which is phase separated from the modified polyphenylene ether copolymer in such a cured state of the resin composition and has a Tg of 20° C. or lower, an obtained cured product is considered to decrease in elastic modulus, alleviating stress generated during heating. This enables reduction of a coefficient of thermal expansion along a surface of a laminate, and thus an excellent effect of reducing warpage in, for example, a package substrate can be obtained.

Since the high-molecular-weight compound of the present exemplary embodiment has a Tg of 20° C. or lower, a CTE (coefficient of thermal expansion) of the high-molecular-weight compound is always in an α2 region in a temperature range of room temperature or higher where a package substrate is typically used. In the α2 region, the elasticity is low, and the CTE is always constant. Accordingly, the high-molecular-weight compound is stable in the temperature range of room temperature or higher. And a cured product of the polyphenylene ether resin composition is also stable because a change in CTE does not occur until a temperature of the cured product reaches Tg of a cured product of the modified polyphenylene ether copolymer (and a crosslinking agent described later in some cases).

Since the high-molecular-weight compound has a number-average molecular weight Mn ranging from 1000 to 10000, inclusive, it has an advantage of giving excellent moldability without increasing viscosity of a varnish. The high-molecular-weight compound having a number-average molecular weight Mn of more than 10000 increases viscosity of a varnish to possibly cause a decrease in impregnation properties of the varnish into a fabric substrate. Further, such a high-molecular-weight compound increases melt viscosity of the resin composition to easily cause molding defects. On the other hand, the high-molecular-weight compound having a Mn of less than 1000 becomes easily compatible with the modified polyphenylene ether copolymer to be less likely to reduce the CTE of a cured product obtained.

When the high-molecular-weight compound is compatible with the modified polyphenylene ether copolymer and has a Tg of 20° C. or lower, a cured product of the resin composition according to the present exemplary embodiment may possibly increase the CTE. Meanwhile, when the high-molecular-weight compound has a Tg of higher than 20° C., a cured product of the resin composition according to the present exemplary embodiment may possibly increase the CTE.

Presence or absence of phase separation in a cured state of the resin composition can be confirmed by subjecting the cured product to dynamic mechanical analysis (DMA). When the cured product is not phase separated, only one peak of loss elastic modulus E" appears in DMA, whereas when the cured product is phase separated, two peaks of E" appears. one of the two peaks is derived from a cured product of the modified polyphenylene ether copolymer (and a crosslinking agent described later), and the other of the two peaks is derived from the high-molecular-weight compound. It is preferable that these two peaks of E" respectively exist in a temperature range of 60° C. or lower and a temperature range of 180° C. or higher.

As the high-molecular-weight compound of the present exemplary embodiment, any high-molecular-weight compound can be used without any particular limitation as long as the high-molecular-weight compound has the characteristics described above and the like. It is preferable that the high-molecular-weight compound has a structure of at least one selected from a polybutadiene skeleton and a (meth) acrylate skeleton. The high-molecular-weight compound having such a structure is considered to be capable of more certainly giving a cured product having excellent dielectric characteristics. Further, the high-molecular-weight compound having such a structure also has an advantage of being more easily phase separated from the modified polyphenylene ether copolymer.

More specifically, it is possible to suitably use, as the high-molecular-weight compound of the present exemplary embodiment, for example, polybutadiene, a butadiene-styrene copolymer, and an acrylic copolymer.

Next, the resin composition according to the present exemplary embodiment preferably further contains a crosslinking agent having at least two carbon-carbon unsaturated double bonds per molecule, in addition to the modified polyphenylene ether copolymer and the high-molecular-weight compound. The crosslinking agent crosslinks the modified polyphenylene ether copolymer. By using such a crosslinking agent having at least two unsaturated double bonds in a molecule, a crosslinking structure of the modified polyphenylene ether copolymer can certainly formed to attain high Tg and improvement of the heat resistance.

The crosslinking agent is not particularly limited as long as the crosslinking agent is a compound that has at least two carbon-carbon unsaturated double bonds per molecule and functions as a crosslinking agent for the modified polyphenylene ether copolymer.

As a specific example of the compound used as the crosslinking agent, a compound represented by a following formula is preferred.

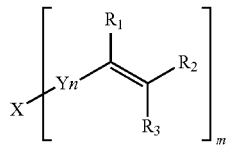

(In the formula, m represents an integer of 1 to 3, n represents 0 or 1, and $R^1$ to $R^3$ independently represent a hydrogen atom or an alkyl group. X represents any one of an arylene group, a group having a tricyclodecane skeleton, and an isocyanurate group. Y represents

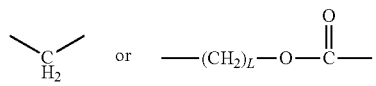

[in the formula, L represents an integer of 1 or more].)

More specific examples include trialkenylisocyanurate compounds such as triallyl isocyanurate (TAIC), polyfunctional methacrylate compounds having at least two methacryl groups in a molecule, polyfunctional acrylate compounds having at least two acryl groups in a molecule, and vinylbenzyl compounds having a vinylbenzyl group in a molecule, such as styrene and divinylbenzene. Among these, the compounds having at least two carbon-carbon unsaturated double bonds in a molecule are preferred. Specifically, the compounds are, for example, trialkenylisocyanurate compounds, polyfunctional acrylate compounds, polyfunctional methacrylate compounds, and divinylbenzene compounds. Specific examples of the polyfunctional acrylate compounds and the polyfunctional methacrylate compounds include dicyclopentadiene acrylate and dicyclopentadiene methacrylate. Especially, there can be preferably used, for example, tricyclodecane dimethanol dimethacrylate (DCP) represented by following formula (α) and tricyclodecane dimethanol dimethacrylate (A-DCP) represented by following formula (β). Use of these compounds that causes a curing reaction with the modified polyphenylene ether copolymer is considered to more suitably form crosslinks, giving a cured product of the resin composition according to the present exemplary embodiment that has higher heat resistance. As another specific example of the compound used as the crosslinking agent, there can also be used a compound represented by a following formula.

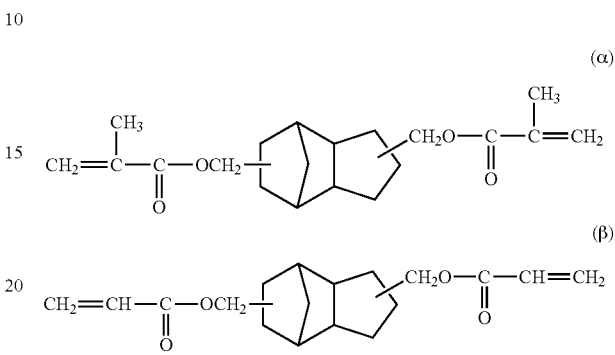

As the crosslinking agent, the compounds exemplified above may be used alone or in combination of two or more. Further, a compound having at least two carbon-carbon unsaturated double bonds in a molecule may be used in combination with a compound having one carbon-carbon unsaturated double bond in a molecule. Specific examples of the compound having one carbon-carbon unsaturated double bond in a molecule include a compound having one vinyl group in a molecule (monovinyl compound).

As regards a content ratio among the components, the content ratio of the high-molecular-weight compound ranges preferably from 5 parts by mass to 50 parts by mass, inclusive, more preferably from 10 parts by mass to 30 parts by mass, inclusive, relative to 100 parts by mass of the modified polyphenylene ether copolymer (and a total of the modified polyphenylene ether copolymer and the crosslinking agent when the crosslinking agent is contained). With the content ratio of the high-molecular-weight compound falling within the above range, it is possible to reduce the CTE along a surface of a cured product without deteriorating the heat resistance of the cured product.

When the resin composition according to the present exemplary embodiment contains the crosslinking agent, a content ratio of the modified polyphenylene ether copolymer ranges preferably from 50 parts by mass to 99 parts by mass, inclusive, more preferably from 65 parts by mass to 95 parts by mass, inclusive, relative to 100 parts by mass of the total of the modified polyphenylene ether copolymer and the crosslinking agent. On the other hand, a content ratio of the crosslinking agent ranges preferably from 1 part by mass to 50 parts by mass, inclusive, more preferably from 5 parts by mass to 35 parts by mass, inclusive, relative to 100 parts by mass of the total of the modified polyphenylene ether copolymer and the crosslinking agent. That is, the content ratio by mass between the modified polyphenylene ether copolymer and the crosslinking agent ranges preferably from 99:1 to 50:50, more preferably from 95:5 to 65:35. With the content ratio between the modified polyphenylene ether copolymer and the crosslinking agent falling within the above range, the resin composition gives a cured product having more excellent heat resistance and adhesiveness. This is considered to be brought about by suitable progress of the curing reaction between the modified polyphenylene ether copolymer and the crosslinking agent.

The "content ratio" in the present exemplary embodiment refers to neither a blending ratio when the components are blended to prepare the resin composition nor a component ratio in a varnish state of the resin composition, but refers to a component ratio in a so-called "stage B state" where the resin composition is half-cured.

The content ratio among the components in the stage B state can be measured by a combination of, for example, nuclear magnetic resonance analysis (NMR), gas chromatography mass spectrometry (GC-MS), and direct-infusion mass spectrometry (DI-MS).

The polyphenylene ether resin composition according to the present exemplary embodiment may either contain the modified polyphenylene ether copolymer and the high-molecular-weight compound or contain the modified polyphenylene ether copolymer, the high-molecular-weight compound, and the crosslinking agent. The polyphenylene ether resin composition may further contain another component. Examples of the other component include an inorganic filler, a flame retardant, an additive, and a reaction initiator.

Particularly, the resin composition according to the present exemplary embodiment preferably further contains an inorganic filler.

The inorganic filler that can be used in the present exemplary embodiment is not particularly limited. Examples of the inorganic filler include spherical silica, barium sulfate, silicon oxide powder, crushed silica, fired talc, barium titanate, titanium oxide, clay, alumina, mica, boehmite, zinc borate, zinc stannate, and other metal oxides and metal hydrates. Addition of such an inorganic filler to the resin composition enables suppression of thermal expansion in a laminate and an increase in dimensional stability.

Further, silica is preferably used as the inorganic filler for an advantage of improving the heat resistance and the dielectric dissipation factor (Df) of a laminate.

When containing the inorganic filler, the resin composition preferably contains the inorganic filler in a range from 40 parts by mass to 200 parts by mass, inclusive, relative to 100 parts by mass of a total of the modified polyphenylene ether copolymer, the high-molecular-weight compound, and the crosslinking agent. The resin composition containing the inorganic filler in a content ratio of more than 200 parts by mass may possibly cause a decrease in impregnation properties of a varnish into a base during preparation of a prepreg or a decrease in adhesive force of a laminate to a copper foil.

The polyphenylene ether resin composition according to the present exemplary embodiment preferably further contains a reaction initiator. The polyphenylene ether resin composition is capable of progressing the curing reaction even in high temperature as long as the resin composition contains the modified polyphenylene ether copolymer and the crosslinking agent for the copolymer. A process condition, however, sometimes makes it difficult to raise temperature as high as curing proceeds, so that a reaction initiator may be added. Addition of the reaction initiator is considered to enable an increase in reactivity between the modified polyphenylene ether copolymer and the crosslinking agent to attain the improvement of the Tg and the heat resistance.

The reaction initiator is not particularly limited as long as the reaction initiator is capable of promoting the curing reaction between the modified polyphenylene ether copolymer and the crosslinking agent. Specific examples include oxidizing agents such as α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. Further, a carboxylic acid metal salt or the like can be used in combination as necessary. This makes it possible to further promote the curing reaction. Among these, α,α'-bis(t-butylperoxy-m-isopropyl)benzene is preferably used. Since α,α'-bis(t-butylperoxy-m-isopropyl)benzene initiates a reaction at relatively high temperature, it is possible to suppress promotion of the curing reaction at a point of time when curing is not required, such as in prepreg drying, and it is possible to suppress a decrease in preservability of the polyphenylene ether resin composition. Further, α,α'-bis(t-butylperoxy-m-isopropyl)benzene having low volatility does not vaporize during prepreg drying and during preservation to be good in stability. The reaction initiators may be used alone or in combination of two or more.

When the polyphenylene ether resin composition according to the present exemplary embodiment contains the reaction initiator, a content ratio of the reaction initiator preferably ranges from about 0.01 parts by mass to 3 parts by mass, inclusive, relative to 100 parts by mass of the total of the modified polyphenylene ether copolymer and the high-molecular-weight compound (together with the crosslinking agent as necessary).

Further, the polyphenylene ether resin composition according to the present exemplary embodiment preferably contains a flame retardant. Addition of the flame retardant enables a further increase in flame retardancy of a cured product of the polyphenylene ether resin composition. The flame retardant is not particularly limited but is preferably a halogen-free flame retardant in consideration of environment. Especially, it is preferred to use a phosphoric flame retardant, and specific examples include phosphoric acid ester compounds such as condensed phosphoric acid ester and cyclic phosphoric acid ester; phosphazene compounds such as a cyclic phosphazene compound; phosphinate compounds such as phosphinic acid metal salts, e.g., a dialkylphosphinic acid aluminum salt, and melamine flame retardants such as melamine phosphate and melamine polyphosphate.

At least one selected from a phosphinate compound, a phosphoric acid ester compound, and a phosphazene compound is more preferred.

As the flame retardant, compatible and incompatible flame retardants with the resin components of the present exemplary embodiment may be used alone or in combination. Combination use is considered to further increase an effect of the flame retardancy. Examples of the compatible flame retardant with the resin components include a phosphazene compound and a phosphoric acid ester compound. Examples of the incompatible flame retardant with the resin components include a phosphinate compound.

Further, the polyphenylene ether resin composition according to the present exemplary embodiment may also contain another additive as described above. Examples of the additive include antifoaming agents such as a silicone-based antifoaming agent and an acrylic acid ester-based antifoaming agent, a thermostabilizer, an antistatic agent, an ultraviolet absorber, a dye and a pigment, a lubricant, and dispersants such as a wet dispersant.

FIG. 1 is a schematic sectional view illustrating a prepreg according to an exemplary embodiment. Prepreg 1 according to the present exemplary embodiment includes resin layer 2 having a half-cured product of the polyphenylene ether resin composition described above, and fibrous substrate 3 provided in resin layer 2.

In order to produce prepreg 1 according to the present exemplary embodiment, the polyphenylene ether resin composition is prepared into a varnish and used in many cases for a purpose of impregnating base (fibrous substrate) 3 for forming prepreg 1 with the resin composition. That is, the polyphenylene ether resin composition is typically prepared into a varnish (resin varnish) in many cases. Such a resin varnish is prepared as follows, for example.

First, components that are soluble in an organic solvent, such as the modified polyphenylene ether copolymer, the high-molecular-weight compound, the crosslinking agent, and the compatible flame retardant (the crosslinking agent and the compatible flame retardant are added as necessary), are introduced and dissolved in an organic solvent. In this procedure, a resultant mixture may be heated as necessary. Then, a component that is used as necessary and insoluble in an organic solvent, such as the inorganic filler or the incompatible flame retardant, is added and dispersed to a predetermined dispersion state with use of, for example, a ball mill, a bead mill, a planetary mixer, or a roll mill to prepare a varnish resin composition. The organic solvent used herein is not particularly limited as long as the organic solvent dissolves the modified polyphenylene ether copolymer, the high-molecular-weight compound, the crosslinking agent, and the flame retardant (the crosslinking agent and the compatible flame retardant are added as necessary), and the like, and does not inhibit the curing reaction. Specific examples include toluene.

The crosslinking agent contained in the polyphenylene ether resin composition according to the present exemplary embodiment sometimes vaporizes when the varnish is made into a half-cured product (prepreg) in the stage B state through a heating and drying step described later. Therefore, the blending ratio among the components in the varnish is different from the content ratio among the components in the prepreg obtained. Accordingly, it is necessary to adjust the blending ratio among the components in the varnish so that the content ratio among the components in the obtained half-cured product (prepreg) in the stage B state falls within the range described above. For example, an amount of the crosslinking agent which vaporizes in the heating and drying step of making the resin composition into the stage B is figured out in advance. And then calculation is performed for giving a desired content ratio among the components in the resin composition in the stage B state, and blending amounts may be set for the components in a stage of preparing the varnish.

Specifically, when divinylbenzene is used as the crosslinking agent, divinylbenzene vaporizes about 80% by a typical step (heating and drying step) of making the varnish resin composition into the prepreg, for example, a step of impregnating a base having a thickness of 0.1 mm and then heating and drying at 130° C. for about 3 minutes. Accordingly, when the resin composition undergoes the heating and drying step, it is preferred to adjust the blending ratio in the varnish with divinylbenzene charged at about 5 times the content ratio of divinylbenzene in the stage B state.

As a method for producing prepreg 1 with use of an obtained resin varnish, there is exemplified a method of impregnating fibrous substrate 3 with the obtained resin varnish, followed by drying.

Specific examples of fibrous substrate 3 used to produce prepreg 1 include glass cloth, aramid cloth, polyester cloth, glass nonwoven fabric, aramid nonwoven fabric, polyester nonwoven fabric, pulp paper, and Linter paper. Use of glass cloth gives a laminate having excellent mechanical strength, and particularly, flattened glass cloth is preferred. Flattening can specifically be performed by, for example, pressing glass cloth continuously with a pressing roll at appropriate pressure to compress yarn in a flat shape. Fibrous substrate 3 can be generally used that has a thickness ranging, for example, from 0.04 mm to 0.3 mm, inclusive.

The impregnation of fibrous substrate 3 with the resin varnish is performed by, for example, immersion or application. The impregnation can be repeated a plurality of times as necessary. In this procedure, it is also possible to repeat the impregnation with use of a plurality of resin varnishes that are different in composition and concentration, for adjusting the composition (content ratio) and resin amount to those finally desired.

Fibrous substrate 3 that has been impregnated with the resin varnish is heated under desired heating conditions of, for example, a temperature ranging from 80° C. to 170° C. and a time ranging from 1 minute to 10 minutes, to remove the solvent and thus give half-cured (stage B) prepreg 1.

Figure 2:
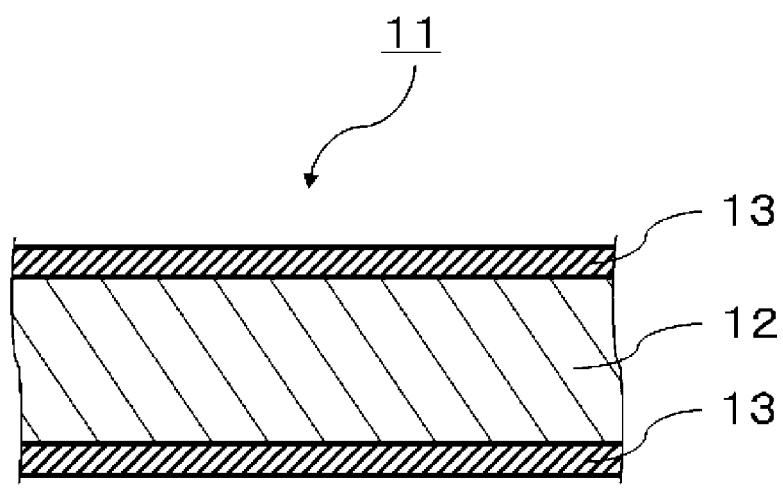
FIG. 2 is a schematic sectional view illustrating a metal-clad laminate according to an exemplary embodiment.

FIG. 2 is a schematic sectional view illustrating a metal-clad laminate according to an exemplary embodiment. Metal-clad laminate 11 according to the present exemplary embodiment includes a cured product of prepreg 1 and metal foil 13 provided on at least one surface (one or both of upper and lower surfaces) of the cured product.

A method for producing metal-clad laminate 11 with use of prepreg 1 includes stacking a metal foil, such as a copper foil, on one or both of upper and lower surfaces of one prepreg 1 or a stacked body of a plurality of prepregs 1, followed by heat pressure molding for lamination and integration, to produce a metal-clad laminate whose one or both surfaces are clad with the metal foil. Heating and pressurizing conditions can be appropriately set depending on thickness of a laminate to be produced, a kind of the resin composition for the prepreg, and the like. For example, temperature can be set to range from 170° C. to 220° C., pressure to range from 1.5 MPa to 5.0 MPa, and time to range from 60 minutes to 150 minutes.

Figure 3:
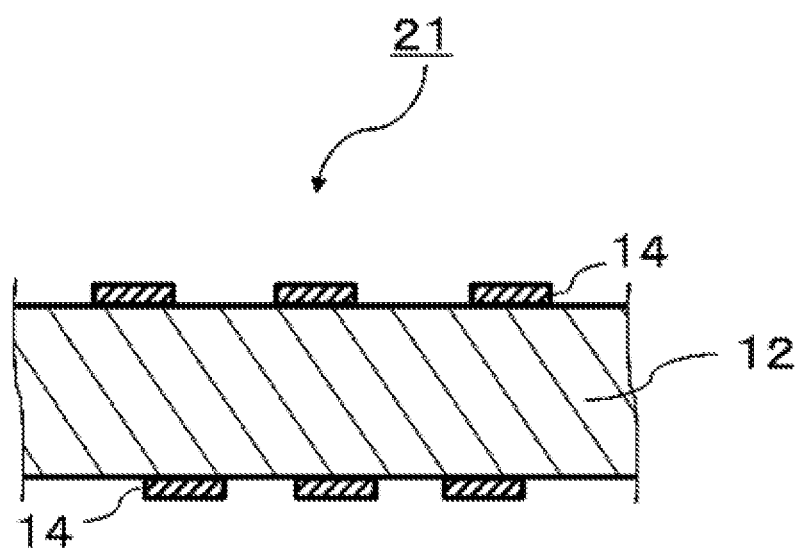
FIG. 3 is a schematic sectional view illustrating a printed wiring board according to an exemplary embodiment.

FIG. 3 is a schematic sectional view illustrating a printed wiring board according to an exemplary embodiment. Printed wiring board 21 according to the present exemplary embodiment includes a cured product of prepreg 1 and conductor pattern 14 provided as a circuit on a surface of the cured product.

A method for producing printed wiring board 21 includes, for example, etching metal foil 13 provided on the surface of metal-clad laminate 11 produced using prepreg 1, to form a circuit pattern, and thus giving printed wiring board 21 that includes conductor pattern 14 provided as a circuit on the surface of the laminate. Alternatively, the method includes curing prepreg 1 and then forming a circuit on the prepreg by plating according to an active method, to give printed wiring board 21. Printed wiring board 21 obtained using the resin composition according to the present exemplary embodiment has excellent dielectric characteristics. Printed wiring board 21 according to the present exemplary embodiment is easily used for mounting due to causing no warpage, even when formed into a package including a semiconductor chip bonded to the printed wiring board, and is excellent in reliability and signal speed.

The present specification discloses various aspects of techniques as described above, from among which main techniques are summarized as follows.

A polyphenylene ether resin composition according to one aspect of the present disclosure contains a modified polyphenylene ether copolymer that a phenolic hydroxy group at a molecular chain end of a polyphenylene ether copolymer is substituted with a substituent having a carbon-carbon unsaturated double bond. The polyphenylene ether resin composition further contains a high-molecular-weight compound having a number-average molecular weight Mn ranging from 1000 to 10000, inclusive and having a glass transition temperature (Tg) of 20° C. or lower and having a number-average molecular weight Mn ranging from 1000 to 10000, inclusive. The glass transition temperature is measured by differential scanning calorimetry. In a cured state of the polyphenylene ether resin composition, the modified polyphenylene ether copolymer is phase separated from the high-molecular-weight compound.

Such composition realizes a resin composition capable of giving a substrate that generates less warpage and has excellent dielectric characteristics.

Further, the polyphenylene ether resin composition preferably contains a crosslinking agent for the modified polyphenylene ether copolymer. The crosslinking agent has at least two carbon-carbon unsaturated double bonds per molecule. Addition of the crosslinking agent is considered to enhance a crosslinking structure of an obtained modified polyphenylene ether copolymer to achieve high Tg and improvement of heat resistance.

The high-molecular-weight compound preferably has a structure of at least one selected from a polybutadiene skeleton and a (meth)acrylate skeleton. The high-molecular-weight compound having such a structure is considered to be capable of giving a cured product having a reduced CTE without deteriorating excellent dielectric characteristics.

Further, in the polyphenylene ether resin composition, the modified polyphenylene ether copolymer preferably has a weight-average molecular weight ranging from 500 to 5000, inclusive and includes 1 to 3 terminal substituents. The polyphenylene ether resin composition containing such a modified polyphenylene ether copolymer has an advantage of being more excellent in moldability.

The substituent at a molecular chain end of the modified polyphenylene ether copolymer is preferably a substituent represented by following formula (1).

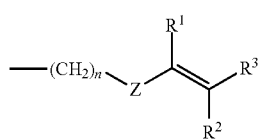

(1)

(In the formula, n represents an integer of 0 to 10, and Z represents an arylene group. When n equals 0, however, Z represents either the arylene group or a carbonyl group. $R^1$ to $R^3$ independently represent a hydrogen atom or an alkyl group.)

The modified polyphenylene ether copolymer having such a configuration has more excellent radical reactivity and is capable of more certainly obtaining the crosslinking structure.

Further, in the polyphenylene ether resin composition, the crosslinking agent is preferably a compound represented by a following formula.

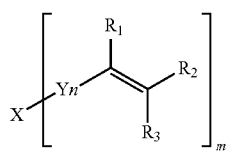

(In the formula, m represents an integer of 1 to 3, n represents 0 or 1, and $R^1$ to $R^3$ independently represent a hydrogen atom or an alkyl group. X represents any one of an arylene group, a group having a tricyclodecane skeleton, and an isocyanurate group. Y represents

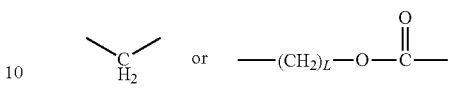

[in the formula, L represents an integer of 1 or more].)

The crosslinking agent having such a configuration is capable of certainly obtaining higher reactivity.

The polyphenylene ether resin composition preferably further contains an inorganic filler. Addition of the inorganic filler is considered to enable further reduction of the CTE and a decrease in dielectric dissipation factor (Df).

A content ratio of the inorganic filler preferably ranges from 40 parts by mass to 200 parts by mass, inclusive, relative to 100 parts by mass of a total of the modified polyphenylene ether copolymer, the high-molecular-weight compound, and the crosslinking agent. With the content ratio of the inorganic filler falling within such a range, the effects described above are considered to be capable of being more certainly obtained without either causing molding defects due to an increase in viscosity or deteriorating the adhesiveness to a copper foil.

The polyphenylene ether resin composition preferably further contains a reaction initiator. Addition of the reaction initiator is considered to enable an increase in radical reactivity between the modified polyphenylene ether copolymer and the crosslinking agent to attain high Tg and improvement of the heat resistance.

The polyphenylene ether resin composition preferably further contains a flame retardant. Addition of the flame retardant enables a further increase in flame retardancy.

A prepreg according to another aspect of the present disclosure includes a resin layer having a half-cured product of the polyphenylene ether resin composition, and a fibrous substrate provided in the resin layer.

A metal-clad laminate according to another aspect of the present disclosure includes a cured product of the prepreg and a metal foil provided on at least one surface of the cured product.

A printed wiring board according to another aspect of the present disclosure includes a cured product of the prepreg and a conductor pattern provided as a circuit on a surface of the cured product.

The metal-clad laminate or the wiring board having such a configuration is easily used for mounting due to causing less warpage, even when formed into a package including a semiconductor chip bonded to the metal-clad laminate or the wiring board, and is excellent in signal speed.

Hereinafter, the present disclosure is described more specifically by way of examples. A scope of the present disclosure, however, is not limited to these examples.

EXAMPLES

First, a modified polyphenylene ether was synthesized. An average number of phenolic hydroxy groups at a molecular chain end per molecule of a polyphenylene ether is indicated as a number of terminal hydroxy groups.

[Synthesis of Modified Polyphenylene Ether 1 (Modified PPE1): Synthesis Method 1]

A polyphenylene ether was reacted with chloromethylstyrene to give modified polyphenylene ether 1 (modified PPE1). Specifically, first, in a 1 L three-neck flask equipped with a temperature controller, a stirrer, a cooling installation, and a dropping funnel, 200 g of a polyphenylene ether (polyphenylene ether having a structure represented by formula (5), SA90 manufactured by SABIC Innovative Plastics, intrinsic viscosity (IV): 0.083 dl/g, number of terminal hydroxy groups: 1.9, weight molecular weight Mw: 1700), 30 g of a mixture of p-chloromethylstyrene and m-chloromethylstyrene in a mass ratio of 50:50 (chloromethylstyrene manufactured by TOKYO CHEMICAL INDUSTRY CO., LTD.: CMS), 1.227 g of tetra-n-butylammonium bromide as a phase transfer catalyst, and 400 g of toluene, and a resultant mixture were introduced and stirred. Then, the resultant mixture was stirred until the polyphenylene ether, chloromethylstyrene, and tetra-n-butylammonium bromide were dissolved in toluene. In the procedure, the mixture was gradually heated so that the liquid temperature reached finally to 75° C. Then, to a resultant solution, a sodium hydroxide aqueous solution (20 g sodium hydroxide/20 g water) as an alkali metal hydroxide was dropped over 20 minutes. Then, the solution was further stirred at 75° C. for 4 hours. Then, after neutralizing the contents of the flask with 10% by mass hydrochloric acid, a large amount of ethanol was introduced. This generated a precipitate in a liquid in the flask. That is, a product contained in a reaction liquid in the flask was reprecipitated. Then, the precipitate was extracted by filtration, washed three times with a mixed liquid of methanol and water in a mass ratio of 80:20, and then dried in vacuo at 80° C. for 3 hours.

The obtained solid was analyzed by $^1$H-NMR (400 MHz, $CDCl_3$, TMS). In a measurement result of NMR, a peak derived from ethenylbenzyl was observed in a range of 5 ppm to 7 ppm. This confirmed that the obtained solid was a modified polyphenylene ether having a group represented by formula (1) at a molecular chain end. Specifically, this confirmed that the obtained solid was an ethenylbenzylated polyphenylene ether.

Also, a molecular weight distribution of the modified polyphenylene ether was measured using GPC. Then, from the molecular weight distribution obtained, a weight-average molecular weight (Mw) was calculated as 1900.

A number of terminal substituents of the modified polyphenylene ether was measured as follows.

First, the modified polyphenylene ether was weighed accurately. The weight at that time is defined as X (mg). Then, the weighed modified polyphenylene ether was dissolved in 25 mL of methylene chloride, and to a resultant solution was added 100 μL of a 10% by mass solution of tetraethylammonium hydroxide (TEAH) in ethanol (TEAH: ethanol (volume ratio)=15:85), and then absorbance (Abs) at 318 nm was measured using a UV spectrophotometer (UV-1600 manufactured by Shimadzu Corporation). Then, from a measurement result, the number of terminal hydroxy groups of the modified polyphenylene ether was calculated by a following formula.

Residual OH amount (μmol/g)=[(25×Abs)/(ε×OPL×X)]×10$^6$

Here, ε represents an absorption coefficient and is 4700 L/mol cm. Further, OPL is an optical length of a cell and is 1 cm.

Since the calculated residual OH amount (number of terminal hydroxy groups) of the modified polyphenylene ether was almost zero, it was found that the hydroxy groups of the unmodified polyphenylene ether were almost completely modified. This revealed that a decrement of the number of terminal hydroxy groups from the number of terminal hydroxy groups of the unmodified polyphenylene ether is the number of terminal substituents of the modified polyphenylene ether. That is, it was found that the number of terminal hydroxy groups of the unmodified polyphenylene ether is the number of terminal substituents of the modified polyphenylene ether. That is to say, the number of terminal substituents was 1.9.

[Synthesis of Modified Polyphenylene Ether 2 (Modified PPE2): Synthesis Method 2]

Modified PPE2 was synthesized in the same method as in the synthesis of modified PPE1 except that a polyphenylene ether described later was used as the polyphenylene ether and a condition described later was employed.

The polyphenylene ether used was a polyphenylene ether (SA120 manufactured by SABIC Innovative Plastics, intrinsic viscosity (IV): 0.125 dl/g, number of terminal hydroxy groups: 1, weight-average molecular weight Mw: 2400).

Next, the reaction between the polyphenylene ether and chloromethylstyrene was conducted in the same method as in the synthesis of modified PPE1 except that 200 g of the polyphenylene ether (SA120), 15 g of CMS, and 0.92 g of the phase transfer catalyst (tetra-n-butylammonium bromide) were used, and a sodium hydroxide aqueous solution (10 g sodium hydroxide/10 g water) was used in place of the sodium hydroxide aqueous solution (20 g sodium hydroxide/20 g water).

Then, an obtained solid was analyzed by $^1$H-NMR (400 MHz, $CDCl_3$, TMS). In a measurement result of NMR, a peak derived from ethenylbenzyl group was observed in a range of 5 ppm to 7 ppm. This confirmed that the obtained solid was a modified polyphenylene ether having a vinylbenzyl group as a substituent in a molecule. Specifically, this confirmed that the obtained solid was an ethenylbenzylated polyphenylene ether.

The number of terminal substituents of the modified polyphenylene ether was measured in the same method as described above. As a result, the number of terminal substituents was 1.

The intrinsic viscosity (IV) of the modified polyphenylene ether was measured in methylene chloride at 25° C. As a result, the intrinsic viscosity (IV) of the modified polyphenylene ether was 0.125 dl/g.

The Mw of the modified polyphenylene ether was measured in the same method as the method described above. As a result, the Mw was 2800.

Examples 1 to 14 and Comparative Examples 1 to 4

Components are described that were used to prepare polyphenylene ether resin compositions in the present examples.

(Component A: Polyphenylene Ether)

Modified PPE1: modified polyphenylene ether obtained by Synthesis Method 1 described above Modified PPE2: modified polyphenylene ether obtained by Synthesis Method 2 described above Modified PPE3: SA9000 manufactured by SABIC Innovative Plastics (modified polyphenylene ether obtained by modifying polyphenylene ether represented by formula (7) at terminal hydroxy group with methacryl group), Mw: 1700, number of terminal substituents: 2

Unmodified PPE1: polyphenylene ether having hydroxy group at molecular chain end (SA120 manufactured by SABIC Innovative Plastics, intrinsic viscosity (IV) 0.125 dl/g, number of terminal hydroxy groups: 1, weight-average molecular weight Mw: 2600)

(Component B: High-Molecular-Weight Compound)

Polybutadiene ("Ricon 156" manufactured by Cray Valley USA, LLC, (I) high-molecular-weight compound having polybutadiene skeleton, number-average molecular weight: 1400, Tg: −55° C.)

Butadiene-styrene copolymer ("Ricon 100" manufactured by Cray Valley USA, LLC, (I) high-molecular-weight compound having polybutadiene skeleton, number-average molecular weight: 4500, Tg: −22° C.)

Acrylic polymer ("UP-1080" manufactured by TOAGOSEI CO., LTD., (II) high-molecular-weight compound having (meth)acrylate skeleton, number-average molecular weight: 2400, Tg: −61° C.)

Acrylic polymer ("SG-80H" manufactured by Nagase ChemteX Corporation, (II) high-molecular-weight compound having (meth)acrylate skeleton, number-average molecular weight: 150000, Tg: 11° C.)

Styrene-acrylic copolymer ("UH-2170" manufactured by TOAGOSEI CO., LTD., (II) high-molecular-weight compound having (meth)acrylate skeleton, number-average molecular weight: 4600, Tg: 60° C.)

Polystyrene ("HIMER ST-95" manufactured by Sanyo Chemical Industries, Ltd., number-average molecular weight: 4600, Tg: 42° C.)

The Tg of the high-molecular-weight compounds were measured by DSC. The number-average molecular weight referred to herein is a value measured in terms of polystyrene by, for example, GPC.

(Component C: Crosslinking Agent)

DCP: tricyclodecane dimethanol dimethacrylate (having structure represented by formula (a), manufactured by Shin-Nakamura Chemical Co., Ltd.)

TAIC: triallyl isocyanurate (manufactured by Nihon Kasei Co., Ltd.)

DVB810: divinylbenzene (manufactured by NIPPON STEEL & SUMIKIN CHEMICAL CO., LTD.)

(Component D: Inorganic Filler)

Spherical silica surface-treated with vinylsilane ("SC2300-SVJ", manufactured by Admatechs Company Limited)

(Component E: Reaction Initiator)

Reaction initiator: 1,3-bis(butylperoxyisopropyl) benzene (PERBUTYL P manufactured by NOF CORPORATION)

(Component F: Flame Retardant)

Phosphinate compound ("OP-935," phosphorus concentration: 23%, manufactured by Clariant (Japan) K.K.)

Phosphoric acid ester compound ("PX-200," phosphorus concentration: 8%, manufactured by DAIHACHI CHEMICAL INDUSTRY CO., LTD.)

Phosphazene compound ("SPB100," phosphorus concentration: 13%, manufactured by Otsuka Chemical Co., Ltd.)

[Preparation Method]

(Resin Varnish)

First, a modified polyphenylene ether was mixed with toluene, and a resultant mixed liquid was heated to 80° C. for dissolution of the modified polyphenylene ether in toluene to give a 50% by mass solution of the modified polyphenylene ether in toluene. Then, a high-molecular-weight compound (and a crosslinking agent in Example 2 and the following examples) was added to the resultant solution of the modified polyphenylene ether in toluene so as to give a ratio described in Table 1, followed by stirring for 30 minutes for complete dissolution. Subsequently, an inorganic filler, a reaction initiator, a flame retardant, and the like were further added and dispersed with a ball mill to give a varnish resin composition (resin varnish).

(Prepreg)

A prepreg was produced using the varnish prepared above and used for following evaluations.

For the prepreg, glass cloth WEA 1078, #1078 type manufactured by Nitto Boseki Co., Ltd. was used as a woven fabric substrate. Subsequently, the woven fabric substrate was impregnated with the resin varnish so that a cured product had a thicknesses of 60 µm, and the woven fabric substrate with the resin varnish was heated and dried at 120° C. for 3 minutes until the resin varnish became half-cured, to give a prepreg.

(Metal-Clad Laminate)

A copper foil (GT-MP manufactured by Furukawa Electric Co., Ltd.) with a thickness of 12 m was disposed on both sides of one prepreg produced above to give an object to be pressurized, and the object was heated and pressurized under vacuum and under conditions of a temperature of 220° C. and a pressure of 40 kgf/cm$^2$ for 90 minutes to give copper-clad laminate (CCL) A on both surfaces of which the copper foil was bonded and that had a thickness of 0.06 mm.

Further, 12 prepregs produced above were stacked and heated and formed in the same method as described above to give copper-clad laminate B having a thickness of 0.72 mm.

1. Test Example 1

The prepreg and the laminates for evaluation that were prepared as described above were evaluated by methods described below.

[Presence or Absence of Phase Separation]

A cured product (obtained by removing the copper foils from copper-clad laminate A obtained above) was subjected to dynamic mechanical analysis (DMA) to confirm phase separation. Using "DMS6100" manufactured by SII NanoTechnology Inc., the modified polyphenylene ether (and the crosslinking agent when contained) and the high-molecular-weight compound were determined as not phase separated (NG) when only one peak of E" (loss elastic modulus) appeared in DMA, whereas determined as phase separated (OK) when two peaks of E" were confirmed.

[Tg(° C.)]

Using, as a sample, cured product obtained by removing the copper foils from copper-clad laminate A, a maximum value of tanδ (loss elastic modulus/storage elastic modulus) was measured by dynamic mechanical analysis (DMA), and the maximum value was defined as Tg. The measurement was performed with use of a dynamic viscoelasticity measuring device ("DMS6100" manufactured by SII NanoTechnology Inc.) with use of a tensile module, under a temperature rise condition of 5° C./min.

[CTE (coefficient of thermal expansion) (ppm/° C.)]

Using, as a sample, cured product obtained by removing the copper foils from copper-clad laminate A, a coefficient of thermal expansion along a surface at a temperature of lower than the glass transition temperature of the resin cured product was measured by TMA (thermo-mechanical analysis) according to JIS C 6481. The measurement was performed with use of a TMA device ("TMA6000" manufactured by SII NanoTechnology Inc.) in a range from 30° C. to 300° C.

[Heat Resistance]

In compliance with a standard of JIS C 6481, copper-clad laminate A that was cut out in a predetermined size was left to stand still in a thermostatic chamber set at 270° C., 280° C., and 290° C. for 1 hour and then extracted. Subsequently, an evaluation was performed by visually observing sample pieces, determining one that was treated at 290° C. and generated no blister as "VG", one that was treated at 280° C. and generated no blister as "OK", one that was treated at 270° C. and generated no blister as "NB", and one that was treated at 270° C. and generated a blister as "NG".

[Amount of Warpage in Package (Gm)]

First, a flip chip (FC) was bonded to and thus mounted on a substrate with a stiffener ("HCV5313HS" manufactured by Panasonic Corporation) to produce a simple FC mounting package (PKG) (size 16 mm×16 mm) for measuring an amount of warpage in the PKG. Here, used as the FC was a Si chip having a size of 15.06 mm×15.06 mm×0.1 mm and carrying 4356 solder balls (height 80 μm). Used as the substrate was one obtained by removing the copper foils from copper-clad laminate A.

Next, the FC mounting PKG was measured for warpage with use of warpage measurement system ("THERMOIRE PS200" manufactured by Akrometrix, LLC) according to a shadow moire measurement technique. The amount of warpage in the FC mounting PKG was acquired as a difference between a maximum value and a minimum value of the amount of warpage in the PKG that was heated from 25° C. to 260° C. and then cooled to 25° C.

[Adhesive Force to Copper Foil]

Copper-clad laminate A was measured, in compliance with JIS C 6481, for peel strength of a copper foil from an insulating layer. The copper foil on which a pattern having a width of 10 mm and a length of 100 mm was formed was peeled by a tensile test machine at a speed of 50 mm/min to measure peel strength in the peeling, and the resultant peel strength was defined as adhesive strength to the copper foil. A measurement unit is kN/m.

[Appearance of Etched Laminate]

A laminate obtained by removing the copper foils from copper-clad laminate A through etching was visually observed and evaluated by confirming a void and a blur.

OK: no void, no blur

NG: void, blur, and bleeding of resin observed on surface of 300 mm×300 mm laminate

[Dielectric Characteristics (Relative Dielectric Constant and Dielectric Dissipation Factor)]

A substrate for evaluation was measured for a relative dielectric constant and a dielectric dissipation factor at 10 GHz by a cavity resonator perturbation method. As the substrate for evaluation, a laminate was used that was obtained by removing the copper foils from copper-clad laminate B. Specifically, the relative dielectric constant and the dielectric dissipation factor of the substrate for evaluation were measured at 10 GHz with use of a network analyzer (N5230A manufactured by Agilent Technologies).

Test results are shown in Table 1. In Table 1, "Ex." represents Example, and "C. Ex." represents Comparative Example.

TABLE 1

| | Component | | Molecular weight Mn | Tg | Ex. 1 | Ex. 2 | Ex. 3 | Ex. 4 | Ex. 5 |
|---|---|---|---|---|---|---|---|---|---|
| A | Modified PPE1 | | | | 86 | 75 | | | 75 |
| | Modified PPE2 | | | | | | 75 | | |
| | Modified PPE3 | | | | | | | 75 | |
| | Unmodified PPE1 | | | | | | | | |
| B | Ricon156 | Polybutadiene | 1400 | −55 | 14 | 12.5 | 12.5 | 12.5 | |
| | Ricon100 | Butadiene-styrene copolymer | 4500 | −22 | | | | | 12.5 |
| | UP-1080 | Acrylic polymer | 2400 | −61 | | | | | |
| | SG-80H | Acrylic polymer | 150000 | 11 | | | | | |
| | UH-2170 | Acrylic polymer | 4600 | 60 | | | | | |
| | HIMER ST-95 | Polystyrene | 4000 | 42 | | | | | |
| C | DCP | | | | | 12.5 | 12.5 | 12.5 | 12.5 |
| | TAIC | | | | | | | | |
| | DCP810 | | | | | | | | |
| D | SC2300-SVJ | | | | 100 | 100 | 100 | 100 | 100 |
| E | PERBUTYL P | | | | 1 | 1 | 1 | 1 | 1 |
| F | OP935 | | | | | | | | |
| | SPB100 | | | | | | | | |
| | PX200 | | | | | | | | |
| | Presence or absence of phase separation | | | | OK | OK | OK | OK | OK |
| | Tg (° C.) | | | | 200 | 220 | 215 | 213 | 220 |
| | CTE (ppm/° C.) | | | | 14 | 13 | 13 | 13 | 12 |
| | Heat resistance | | | | NB | OK | OK | OK | OK |
| | Amount of warpage in PKG (μm) | | | | 470 | 450 | 450 | 455 | 420 |
| | Adhesive strength to copper foil (kN/m) | | | | 0.45 | 0.60 | 0.60 | 0.60 | 0.60 |
| | Appearance of etched CCL | | | | OK | OK | OK | OK | OK |
| | Relative dielectric constant Dk@10 GHz | | | | 3.5 | 3.5 | 3.6 | 3.6 | 3.5 |

TABLE 1-continued

|  |  | | | 0.0046 | 0.0045 | 0.0046 | 0.0046 | 0.0045 |
|---|---|---|---|---|---|---|---|---|
| Dielectric dissipation factor Df@10 GHz |  | | | | | | | |
| Flame retardancy |  | | | — | — | — | — | — |

|  | Component | Molecular weight Mn | Tg | Ex. 6 | Ex. 7 | Ex. 8 | Ex. 9 | Ex. 10 |
|---|---|---|---|---|---|---|---|---|
| A | Modified PPE1 |  |  | 75 | 75 | 75 | 75 | 75 |
|  | Modified PPE2 |  |  |  |  |  |  |  |
|  | Modified PPE3 |  |  |  |  |  |  |  |
|  | Unmodified PPE1 |  |  |  |  |  |  |  |
| B | Ricon156 | Polybutadiene | 1400 | −55 |  | 12.5 | 12.5 | 12.5 | 12.5 |
|  | Ricon100 | Butadiene-styrene copolymer | 4500 | −22 |  |  |  |  |  |
|  | UP-1080 | Acrylic polymer | 2400 | −61 | 12.5 |  |  |  |  |
|  | SG-80H | Acrylic polymer | 150000 | 11 |  |  |  |  |  |
|  | UH-2170 | Acrylic polymer | 4600 | 60 |  |  |  |  |  |
|  | HIMER ST-95 | Polystyrene | 4000 | 42 |  |  |  |  |  |
| C | DCP |  |  |  | 12.5 |  |  | 12.5 | 12.5 |
|  | TAIC |  |  |  |  | 12.5 |  |  |  |
|  | DCP810 |  |  |  |  |  | 12.5 |  |  |
| D | SC2300-SVJ |  |  |  | 100 | 100 | 100 | 0 | 200 |
| E | PERBUTYL P |  |  |  | 1 | 1 | 1 | 1 | 1 |
| F | OP935 |  |  |  |  |  |  |  |  |
|  | SPB100 |  |  |  |  |  |  |  |  |
|  | PX200 |  |  |  |  |  |  |  |  |
|  | Presence or absence of phase separation |  |  |  | OK | OK | OK | OK | OK |
|  | Tg (° C.) |  |  |  | 220 | 215 | 225 | 220 | 220 |
|  | CTE (ppm/° C.) |  |  |  | 12 | 13 | 13 | 15 | 11 |
|  | Heat resistance |  |  |  | OK | OK | OK | NB | VG |
|  | Amount of warpage in PKG (μm) |  |  |  | 423 | 455 | 448 | 470 | 400 |
|  | Adhesive strength to copper foil (kN/m) |  |  |  | 0.60 | 0.60 | 0.60 | 0.70 | 0.53 |
|  | Appearance of etched CCL |  |  |  | OK | OK | OK | OK | OK |
|  | Relative dielectric constant Dk@10 GHz |  |  |  | 3.6 | 3.7 | 3.5 | 3.4 | 3.8 |
|  | Dielectric dissipation factor Df@10 GHz |  |  |  | 0.0047 | 0.0045 | 0.0044 | 0.0046 | 0.0044 |
|  | Flame retardancy |  |  |  | — | — | — | — | — |

|  | Component | Molecular weight Mn | Tg | Ex. 11 | Ex. 12 | Ex. 13 | Ex. 14 |
|---|---|---|---|---|---|---|---|
| A | Modified PPE1 |  |  | 75 | 75 | 75 | 75 |
|  | Modified PPE2 |  |  |  |  |  |  |
|  | Modified PPE3 |  |  |  |  |  |  |
|  | Unmodified PPE1 |  |  |  |  |  |  |
| B | Ricon156 | Polybutadiene | 1400 | −55 | 12.5 | 12.5 | 12.5 | 12.5 |
|  | Ricon100 | Butadiene-styrene copolymer | 4500 | −22 |  |  |  |  |
|  | UP-1080 | Acrylic polymer | 2400 | −61 |  |  |  |  |
|  | SG-80H | Acrylic polymer | 150000 | 11 |  |  |  |  |
|  | UH-2170 | Acrylic polymer | 4600 | 60 |  |  |  |  |
|  | HIMER ST-95 | Polystyrene | 4000 | 42 |  |  |  |  |
| C | DCP |  |  |  | 12.5 | 12.5 | 12.5 | 12.5 |
|  | TAIC |  |  |  |  |  |  |  |
|  | DCP810 |  |  |  |  |  |  |  |
| D | SC2300-SVJ |  |  |  | 300 | 100 | 100 | 100 |
| E | PERBUTYL P |  |  |  | 1 | 1 | 1 | 1 |
| F | OP935 |  |  |  |  | 15 | 10 | 10 |
|  | SPB100 |  |  |  |  |  | 5 |  |
|  | PX200 |  |  |  |  |  |  | 5 |
|  | Presence or absence of phase separation |  |  |  | OK | OK | OK | OK |
|  | Tg (° C.) |  |  |  | 220 | 220 | 210 | 205 |
|  | CTE (ppm/° C.) |  |  |  | 10 | 13 | 14 | 14 |

TABLE 1-continued

| | | | | C. Ex. 1 | C. Ex. 2 | C. Ex. 3 | C. Ex. 4 |
|---|---|---|---|---|---|---|---|
| Heat resistance | | | | VG | OK | OK | OK |
| Amount of warpage in PKG (μm) | | | | 390 | 460 | 465 | 465 |
| Adhesive strength to copper foil (kN/m) | | | | 0.35 | 0.58 | 0.56 | 0.55 |
| Appearance of etched CCL | | | | OK | OK | OK | OK |
| Relative dielectric constant Dk@10 GHz | | | | 4 | 3.6 | 3.6 | 3.5 |
| Dielectric dissipation factor Df@10 GHz | | | | 0.0043 | 0.0047 | 0.0047 | 0.0046 |
| Flame retardancy | | | | — | V-0 | V-0 | V-0 |

| | Component | | Molecular weight Mn | Tg | C. Ex. 1 | C. Ex. 2 | C. Ex. 3 | C. Ex. 4 |
|---|---|---|---|---|---|---|---|---|
| A | Modified PPE1 | | | | | 75 | 75 | 75 |
| | Modified PPE2 | | | | | | | |
| | Modified PPE3 | | | | | | | |
| | Unmodified PPE1 | | | | 75 | | | |
| B | Ricon156 | Polybutadiene | 1400 | −55 | 12.5 | | | |
| | Ricon100 | Butadiene-styrene copolymer | 4500 | −22 | | | | |
| | UP-1080 | Acrylic polymer | 2400 | −61 | | | | |
| | SG-80H | Acrylic polymer | 150000 | 11 | | 12.5 | | |
| | UH-2170 | Acrylic polymer | 4600 | 60 | | | 12.5 | |
| | HIMER ST-95 | Polystyrene | 4000 | 42 | | | | 12.5 |
| C | DCP | | | | 12.5 | 12.5 | 12.5 | 12.5 |
| | TAIC | | | | | | | |
| | DCP810 | | | | | | | |
| D | SC2300-SVJ | | | | 100 | 100 | 100 | 100 |
| E | PERBUTYL P | | | | 1 | 1 | 1 | 1 |
| F | OP935 | | | | | | | |
| | SPB100 | | | | | | | |
| | PX200 | | | | | | | |
| | Presence or absence of phase separation | | | | OK | OK | OK | NG |
| | Tg (° C.) | | | | 186 | 220 | 220 | 199 |
| | CTE (ppm/° C.) | | | | 14 | 12 | 17 | 19 |
| | Heat resistance | | | | NG | OK | OK | OK |
| | Amount of warpage in PKG (μm) | | | | 480 | 430 | 550 | 580 |
| | Adhesive strength to copper foil (kN/m) | | | | 0.48 | 0.60 | 0.60 | 0.45 |
| | Appearance of etched CCL | | | | OK | NG | OK | OK |
| | Relative dielectric constant Dk@10 GHz | | | | 3.6 | 3.6 | 3.6 | 3.5 |
| | Dielectric dissipation factor Df@10 GHz | | | | 0.0046 | 0.0047 | 0.0046 | 0.0045 |
| | Flame retardancy | | | | — | — | — | — |

The test results demonstrated that the present disclosure can provide a resin composition that gives a cured product having excellent dielectric characteristics, the cured product giving a metal-clad laminate that generates sufficiently less warpage. Particularly, in Example 2 and the following examples where the resin composition contained the crosslinking agent in addition to the modified polyphenylene ether copolymer and the high-molecular-weight compound of the present disclosure, crosslinking between the modified polyphenylene ether copolymer and the crosslinking agent was promoted to give a result of improving the Tg, the heat resistance, and the adhesive strength to the copper foil. Further, addition of the inorganic filler at an appropriate amount enabled improvement of the heat resistance of the laminate and reduction of the amount of warpage in the PKG caused by reduction of the CTE. In the meantime, comparison of Examples 9 and 11 with the other examples demonstrated that addition of the inorganic filler at a predetermined amount gives more excellent adhesiveness and heat resistance.

In contrast, the resin composition of Comparative Example 1 gave a result of higher dielectric characteristics than the dielectric characteristics when the modified polyphenylene ether copolymer was used that had been terminally modified with a substituent having a carbon-carbon unsaturated double bond (Examples), because the resin composition of Comparative Example 1 contained a polyphenylene ether copolymer whose terminal hydroxy group was not modified.

Comparative Example 2 where the high-molecular-weight compound had excessively large molecular weight gave a laminate that had deteriorated appearance after etched, because of an increase in melt viscosity of the resin composition. Comparative Example 3 gave a result of increasing the amount of warpage in the PKG regardless of the phase separation of the modified polyphenylene ether copolymer from the high-molecular-weight compound, because the high-molecular-weight compound that had high Tg increased the CTE. Comparative Example 4 gave a result of further increasing the CTE and the amount of warpage in the PKG from Comparative Example 3, because the modified polyphenylene ether copolymer was compatible with the high-molecular-weight compound and the high-molecular-weight compound had high Tg. This fact makes it easily assumable that when the high-molecular-weight compound even has low Tg but is compatible with the modified polyphenylene ether copolymer, the CTE increases to result in deterioration of the warpage in the PKG, compared with when the high-molecular-weight compound is phase separated from the modified polyphenylene ether copolymer.

2. Test Example 2

Further, the laminates of Examples 12 to 14 were subjected to a test for flame retardancy.

[Flame Retardancy]

Resultant copper-clad laminate A was etched, cut into 127 mm×12.7 mm, and evaluated for flame retardancy in compliance with UL94. As a result, any of the laminates of Examples 12 to 14 showed flame retardancy V-0.

Accordingly, the test demonstrated that the laminates of Examples 12 to 14 also had excellent flame retardancy.

The present disclosure is usable for a polyphenylene ether resin composition, a prepreg, a metal-clad laminate, and a printed wiring board.

What is claimed is:

1. A polyphenylene ether resin composition comprising:
a modified polyphenylene ether copolymer that is modified with a substituent having a carbon-carbon unsaturated double bond at a molecular chain end of a polyphenylene ether copolymer;
a high-molecular-weight compound having a number-average molecular weight Mn ranging from 1000 to 10000, inclusive and having a glass transition temperature (Tg) of 20° C. or lower, the glass transition temperature being measured by differential scanning calorimetry; and
a crosslinking agent for the modified polyphenylene ether copolymer, the crosslinking agent including at least two carbon-carbon unsaturated double bonds per molecule, wherein:
the crosslinking agent includes at least one of dicyclopentadiene acrylate and dicyclopentadiene methacrylate,
the high-molecular-weight compound includes a butadiene-styrene copolymer, and
the modified polyphenylene ether copolymer is phase separated from the high-molecular-weight compound in a cured state of the polyphenylene ether resin composition.

2. The polyphenylene ether resin composition according to claim 1, wherein the modified polyphenylene ether copolymer has a weight-average molecular weight ranging from 500 to 5000, inclusive, and
an average number of the substituent at a molecule chain end in the modified polyphenylene ether copolymer ranges from 1 to 3, inclusive.

3. The polyphenylene ether resin composition according to claim 1, wherein the substituent at a molecular chain end of the modified polyphenylene ether copolymer is represented by following formula (1):

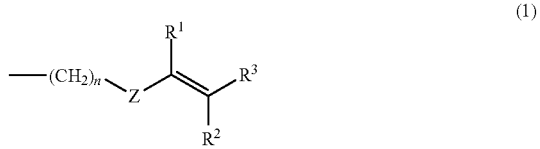

where
n represents an integer of 0 to 10, and
$R^1$ to $R^3$ independently represent a hydrogen atom or an alkyl group, wherein
Z represents either an arylene group or a carbonyl group when n equals 0, and
Z represents an arylene group when n is from 1 to 10.

4. The polyphenylene ether resin composition according to claim 1, further comprising an inorganic filler.

5. The polyphenylene ether resin composition according to claim 4, wherein the content ratio of the inorganic filler ranges from 40 parts by mass to 200 parts by mass, inclusive, relative to 100 parts by mass of a total of the modified polyphenylene ether copolymer, the high-molecular-weight compound, and the crosslinking agent.

6. The polyphenylene ether resin composition according to claim 1, further comprising a reaction initiator.

7. The polyphenylene ether resin composition according to claim 1, further comprising a flame retardant.

8. A prepreg comprising:
a resin layer including a half-cured product of the polyphenylene ether resin composition according to claim 1; and
a fibrous substrate provided in the resin layer.

9. A metal-clad laminate comprising:
a cured product of the prepreg according to claim 8; and
a metal foil provided on at least one surface of the cured product.

10. A printed wiring board comprising:
a cured product of the prepreg according to claim 8; and
a conductor pattern provided as a circuit on a surface of the cured product.

* * * * *